(12) United States Patent
Miyamoto et al.

(10) Patent No.: US 6,673,439 B1
(45) Date of Patent: Jan. 6, 2004

(54) COATED DIAMOND, MANUFACTURING METHOD AND COMPOSITE MATERIAL THEREOF

(75) Inventors: Yoshinari Miyamoto, 1-14-202, Tsukinoki-cho, Ikeda-shi, Osaka (JP); Hideki Moriguchi, Itami (JP)

(73) Assignees: Sumitomo Electric Industries, Ltd., Osaka (JP); Yoshinari Miyamoto, Ikeda (JP)

(*) Notice: Subject to any disclaimer, the term of this patent is extended or adjusted under 35 U.S.C. 154(b) by 67 days.

(21) Appl. No.: 09/856,397

(22) PCT Filed: Sep. 21, 2000

(86) PCT No.: PCT/JP00/06485

§ 371 (c)(1),
(2), (4) Date: May 22, 2001

(87) PCT Pub. No.: WO01/21862

PCT Pub. Date: Mar. 29, 2001

(30) Foreign Application Priority Data

Sep. 22, 1999 (JP) .............................................. 11-268406

(51) Int. Cl.⁷ .......................... C30B 29/04; C04B 35/52
(52) U.S. Cl. ........................ 428/336; 427/185; 427/355; 427/372.2; 427/376.1; 427/376.2; 428/325; 428/408; 428/698
(58) Field of Search ............................. 428/325, 408, 428/698, 216, 336; 427/355, 372.2, 376.1, 376.2, 185

(56) References Cited

U.S. PATENT DOCUMENTS 4,643,741 A * 2/1987 Yu et al.
4,783,368 A * 11/1988 Yamamoto et al.
5,106,392 A * 4/1992 Slutz et al.
5,106,687 A * 4/1992 Tanino et al.
5,879,450 A * 3/1999 Lee et al.
6,001,180 A * 12/1999 Inoue

FOREIGN PATENT DOCUMENTS

| EP | 0503974 | 9/1992 |
| EP | 0577375 | 1/1994 |
| JP | 01290521 | * 11/1989 |
| JP | 5105560 | 4/1993 |
| JP | 6263516 | 9/1994 |
| JP | 08113774 | 5/1996 |
| JP | 09235200 | 9/1997 |
| JP | 11199323 | * 7/1999 |

OTHER PUBLICATIONS

Kinya Miyamoto et al., "Diamond Ryushi no SiC Coating", Nippon Cermaics Kyokai 1999 Nen Nenkai Kouen Yokoushu (Nippon Ceramics Kyokai, Tokyo), Mar., 1999, p. 106.

* cited by examiner

Primary Examiner—Archene Turner
(74) Attorney, Agent, or Firm—W. F. Fasse; W. G. Fasse

(57) ABSTRACT

A coated diamond which is dense and excellent in adherence and enables diamond to exhibit its superior characteristics, a manufacturing method and a composite material of the coated diamond are achieved. The coated diamond includes a diamond (1) and an SiC film (2) coating the diamond (1). The SiC mentioned above is substantially formed of β-SiC and a value of ratio I (220)/I (111) is at least 0.38 and at most 0.55, I (220) representing peak intensity of Miller index (220) of SiC and I (111) representing peak intensity of Miller index (111) thereof.

23 Claims, 2 Drawing Sheets

US 6,673,439 B1

COATED DIAMOND, MANUFACTURING METHOD AND COMPOSITE MATERIAL THEREOF

TECHNICAL FIELD

The present invention relates to a coated diamond to which an SiC coating is applied, a method of manufacturing and a composite material thereof. In particular, the invention relates to a coated diamond with an enhanced density as well as a superior adherence compared with those that have been accomplished, a method of manufacturing and a composite material thereof.

BACKGROUND ART

Diamond has the highest hardness among terrestrial materials and thus has been employed as tool materials. As diamond also has a considerably high thermal conductivity, application to heat sink materials is expected. When diamond is used as tool and heat sink materials, the diamond is molded with metal, ceramic, resin or the like into one piece by means of powder metallurgy and accordingly a composite thereof is produced. On the other hand, when the temperature of diamond is increased in the air, oxidation of the diamond begins at approximately 650° C. A further shortcoming of the diamond is transformation into graphite resultant from dissolution of the diamond in molten metal of Co, Ni, Fe and the like. Then, in order to prevent oxidation as well as chemical reaction between diamond and these materials and to enhance a bonding strength between diamond and metal, ceramic and resin, studies have been conducted on application of a coating layer onto a surface of diamond (Japanese Patent Laying-Open Nos. 5-105560, 6-263516 and 8-113774).

However, conventional techniques of forming a coating layer on a surface of diamond are insufficient in terms of optimization of density, nonuniform thickness, surface properties and coating film thickness which affect quality of the coating layer. In addition, the bonding strength between the coating film and diamond is also insufficient.

The present invention aims to provide a diamond with a coating film that is dense and superior in adherence to enable diamond to exhibit its excellent characteristics, a method of manufacturing the coated diamond and a composite material of the coated diamond.

DISCLOSURE OF THE INVENTION

A coated diamond according to the present invention includes a diamond and a film including SiC as a main component to coat the diamond (hereinafter referred to as SiC film). The SiC is substantially formed of β-SiC. For the SiC film, a value of ratio I (220)/I (111) is at least 0.38 and at most 0.55, I (220) representing peak intensity of Miller index (220) of SiC and I (111) representing peak intensity of Miller index (111) thereof.

The β-SiC is SiC which belongs to one of Nos. 29-1129, 29-1128 and 39-1196 of JCPDS (Joint Committee on Powder Diffraction Standards) card. The film including β-SiC as a main component preferably has at least a partial region which is in a crystallographically identical orientation relationship with respect to adjacent diamond, since such a coating film is unlikely to separate. The crystallographically identical orientation relationship (epitaxial relation) can be determined by irradiating a region in the vicinity of the boundary between the diamond and the SiC film with X-rays or electron beam to take an X-ray diffraction image or electron diffraction image where diffraction patterns of the diamond and SiC film occur. The present invention includes a structure having an intermediate layer between the diamond and the SiC film for alleviating lattice distortion to achieve a regular orientational relation between the diamond and SiC film, i.e., the diamond and SiC film are not directly adjacent to each other.

The β-SiC can be identified by means of X-ray diffraction to measure a lattice constant of SiC, which is approximately 4.36 angstrom. The value of ratio I (220)/I (111) can be calculated by determining peak intensity in X-ray diffraction of Miller indices (220) and (111). As shown by JCPDS card, the value of I (220)/I (111) is usually 0.35. The value of ratio can be set at 0.38 or higher to considerably improve adherence of the β-SiC film to diamond. The ratio is more desirably 0.4 or higher. However, the adherence deteriorates when the ratio exceeds 0.55 and thus the value is desirably 0.55 or lower, more desirably 0.5 or lower.

When β-SiC is of equi-axial grains, the coating film has an enhanced strength and thus is unlikely to separate. Further, toughness of the β-SiC is combined with the property of equi-axial grains to make the coating film more unlikely to separate. Here, "equi-axial grains" refers to the shape of polycrystal grains having no anisotropy, as compared with columnar grains and extended grains having anisotropy. In the coated diamond according to the present invention, carbon atoms in the SiC film are supplied substantially from diamond. As C is supplied from diamond, the surface of diamond is readily coated completely with the β-SiC film which is dense.

The β-SiC film of equi-axial grains is not porous and the film coats the surface of diamond densely and completely. Accordingly, the bonding strength between the coating film and diamond can be enhanced. Here, "film densely coats" means that a uniform coating film covers diamond without leaving a non-coated part.

The SiC film of the coated diamond discussed above could have an Si ratio which is lower near the diamond and higher near the surface of the SiC film. On the contrary, the ratio of carbon atoms could be higher near the diamond and lower near the surface of the SiC film. The Si and carbon ratios in the SiC film can be determined by spectroscopic analysis or EPMA (Electron Probe X-ray Microanalyser) and wavelength dispersive type X-ray spectrometer. For quantitative analysis of a light element like carbon having atomic number 10 or smaller, multi-layer crystal is used as a spectrometer in a wavelength dispersive type spectrometer, the spectrometer is placed in vacuum, and a proportional counter is used as a detector. Alternatively, secondary ion mass spectrometry (SIMS) may be used.

The film containing SiC as a main component of the coated diamond according to the present invention preferably has a thickness of 0.001 to 0.3 μm.

The coating film having the thickness mentioned above prevents the diamond with superior characteristics from deteriorating. Specifically, oxidation resistance can be enhanced and prevention is possible of reaction between the diamond and molten metal of Co, Ni, Fe and the like. The coating film includes SiC with the carbon supplied from the diamond. Therefore, it is difficult to form the coating film with its thickness exceeding 0.3 μm. On the other hand, a smaller thickness less than 0.001 μm lessens the effect of applying the coating. Accordingly, the coating film has a thickness of 0.001 to 0.3 μm.

More preferably, the film containing SiC as a main component of the coated diamond according to the present invention has a thickness ranging from 0.005 to 0.1 μm.

The film thickness of 0.005 µm or greater enables oxidation resistance to be sufficient and superior characteristics of the diamond to be retained. On the other hand, the film thickness can be limited to 0.1 µm or smaller to prevent occurrence of crack in the coating film due to difference in thermal expansion coefficient between the diamond and SiC and to facilitate maintenance of the epitaxial relation between β-SiC and adjacent diamond. Resistance to separation is thus significantly improved.

The SiC of the coated diamond according to the present invention desirably has a mean grain diameter of at most 50 nm for example.

When the mean grain diameter of SiC is 50 nm or smaller, the SiC has an improved strength. The mean grain diameter of SiC is desirably at most 15 nm. The SiC with the mean grain diameter in this range can have a further enhanced strength.

Diamond of the coated diamond according to the present invention is of particulate for example and the mean particle diameter of the diamond is 0.1 to 100 µm.

When the diamond is formed of minute particles with a mean particle diameter of 0.1 to 100 µm, a dense and uniform SiC film is difficult to produce by conventional means. On the other hand, the structure of the present invention enables a dense and uniform β-SiC film to be formed on the surface of diamond of minute particles in a relatively easy manner. Then, with various characteristics of the diamond further enhanced, the SiC-coated diamond can be produced. It is noted that the coated diamond produced by applying a coating onto a powder material for powder metallurgy or the like is the particulate diamond discussed above.

It can be expected that a coated diamond produced by applying a coating onto a single crystal diamond of a certain shape like a plate has an excellent thermal conductivity. When the diamond is polycrystal, a manufacturing method of diamond such as vapor phase synthesis can be employed. Then, a plate-shaped material with a large area size can be prepared at a low cost.

With the structure described above, diamond of a certain shape like a plate is coated. It is accordingly possible to derive superior characteristics of the diamond by using the diamond for electronics materials such as heat sink materials.

The particulate diamond coated with the β-SiC film can be employed as a material for powder metallurgy. Using this coated diamond particles, robust tool materials, electronics materials and the like having an arbitrary shape can be produced with superior diamond characteristics. Here, "particulate diamond" refers to diamond particles and can be referred to as diamond powder alternatively. This relation between particulate and powder is also applied to other materials. The particulate diamond may be single-crystal particles or polycrystal particles. In other words, if the diamond is in the form of powder and can be used for powder metallurgy and the like, particles may be of single crystal or polycrystal.

A composite material according to the present invention includes at least one of metal, ceramic and resin, a diamond, and a β-SiC film coating the diamond, and the material of at least one of metal, ceramic and resin and the diamond coated with that film are connected. In order to sufficiently derive excellent characteristics of the diamond, the SiC film desirably has a thickness of 0.005 to 0.1 µm for example.

The diamond coated with the film having the thickness described above can be used as one component of a composite material to utilize excellent characteristics of the diamond which is firmly incorporated into the composite material. Then, there is a less deterioration of the diamond characteristics. Further, the SiC film is dense and superior in strength and has an excellent adherence to the diamond. Additionally, the SiC film itself has an excellent thermal conductivity so that a composite material to which the diamond is applied enables the diamond to sufficiently exhibit the superior characteristics. When the composite material is formed in one piece through powder metallurgy, the composite material is desirably formed of at least one of particulate metal, particulate ceramic and particulate resin and particulate diamond coated with the coating film explained above.

The particulate material, i.e., powder material can be used to form tool materials or electronics materials into one piece to produce a composite through powder metallurgy. Further, when at least one of metal of at least two kinds, ceramic of at least two kinds and resin of at least two kinds can be included to produce a composite material having an optimum composition based on optimum chemical components according to use.

When a composite material is produced by using the diamond coated with SiC according to the present invention and X-ray diffraction is applied directly to the composite material, calculation of a value of I (220)/I (111) of the SiC coating film could be impossible due to a weak peak intensity of the SiC. In this case, by means of a chemical method using acid or alkaline solution or thermal and mechanical method, the SiC only or the SiC-coated diamond can be obtained from the composite material and X-ray diffraction can be applied to thus obtained material.

According to a method of manufacturing a coated diamond of the present invention, silicon monoxide in solid phase and diamond in solid phase are arranged at respective positions having no contact with each other and allowing passage of gas, and the solid phase silicon monoxide and the solid phase diamond are heated in a temperature range of 1150 to 1450° C.

According this manufacturing method, a chemical reaction of SiO (gas phase)+2C (diamond)→SiC (solid phase)+CO (gas phase) occurs, and carbon supplied from the diamond reacts. As the diamond to be coated is utilized as a source of carbon of SiC, the entire surface of the diamond is coated with a dense and solid β-SiC film. As a conventional technique, formation of SiC through direct reaction between silicon powder and diamond has been proposed (Japanese Patent Laying-Open No. 8-113774). According to the proposed technique, an SiC film is formed through solid phase reaction. A resultant problem is that the SiC is locally formed and thus the diamond surface is likely to become rough. According to the present invention, the SiC film is formed through reaction via gas phase, therefore, diamond can be coated densely and uniformly with the SiC film.

The solid phase silicon monoxide is desirably of particles with a mean particle diameter of 0.1 to 1000 µm for enhancement of density of gas phase SiO. When the mean particle diameter of particulate SiO exceeds 1000 µm, vaporization of SiO does not immediately proceed. Then, it is likely that diamond has any part which is not covered. On the other hand, a mean particle diameter of SiO powder that is less than 0.1 µm results in a high cost and troublesome handling. A more desirable range of the mean particle diameter of SiO powder is 0.5 to 500 µm.

According to the method of manufacturing a coated diamond of the invention, the solid phase silicon monoxide is arranged below the solid phase diamond and a porous separation layer is placed between the silicon monoxide and the diamond.

This structure achieves an arrangement of the silicon monoxide and diamond in a simple manner, the arrangement allowing passage of gas phase while preventing contact between the silicon monoxide and diamond. SiO gas generated from solid phase silicon monoxide moves upward and can contribute to reaction for forming a coating layer on the diamond surface without loss since the diamond is arranged in the close vicinity thereof.

According to the method of manufacturing a coated diamond of the invention, the porous separation layer is a felt formed of carbon.

The carbon felt is formed of the same carbon as that of the diamond and the porous property is stably maintained to allow passage of SiO gas without contacting the silicon monoxide and diamond. In this way, the carbon felt of low cost can be employed to contribute to reaction for forming a coating layer on the diamond surface without loss of generated SiO gas. It is noted that the carbon felt which is used once by the method of the present invention for coating the diamond surface with SiC and accordingly has SiC attached to the surface can thereafter be used continuously for forming an SiC film on diamond without loss of SiO gas. Such a continued use of the carbon felt can contribute to formation of an SiC film on diamond without further loss of SiO gas.

According to the method of manufacturing a coated diamond of the present invention, the silicon monoxide and diamond are placed in a lidded container, the container provided in a high vacuum of $10^{-2}$ Torr or higher, and thereafter subjected to heating.

With this structure discussed above, the reaction for forming the coating layer on the diamond surface can be proceeded with a less oxidation loss and the like and an increased partial pressure of the gas phase SiO.

According to the method of manufacturing a coated diamond of the present invention, the container is an alumina crucible having its interior covered with a carbon sheet. A lid formed of alumina is put on the alumina crucible to shield contents of the alumina crucible from outside air, and the alumina crucible including its contents is heated for 10 minutes to 6 hours.

The manufacturing method described above makes it possible to efficiently form a dense β-SiC film using an apparatus at hand without preparing a special crucible or the like.

According to the method of manufacturing a coated diamond, the diamond and the silicon monoxide placed in the alumina crucible satisfy a weight ratio of (2:1) to (20:1).

According to the method of manufacturing a coated diamond of the invention, the weight ratio in this range enables an SiC film of a uniform thickness to be formed on the diamond surface.

The diamond with its weight smaller than the one represented by (2:1) produces a local part with a greater film thickness. On the other hand, the weight increased to exceed the one represented by (20:1) produces a part of diamond that is not covered with the SiC film.

This diamond may be single crystal diamond with a mean particle diameter of 0.1 to 3000 μm or single crystal and plate-shaped diamond. When the mean particle diameter of particulate diamond exceeds 3000 μm, the diamond is too large as material for powder metallurgy so that a one-piece formed product with a great strength cannot be manufactured. On the other hand, when the mean particle diameter of diamond particles is less than 0.1 μm, the ratio of SiC in the coating film to diamond is too large. Then, superior diamond characteristics cannot be derived as the diamond formed into one-piece. The diamond particles have a mean particle diameter which is more desirably 0.5 μm to 1500 μm.

According to the method of manufacturing a coated diamond of the invention, the diamond may be polycrystal and in the shape of a plate for example.

The plate-shaped diamond can be coated with the film of a high thermal conductivity including SiC as a main component to apply the diamond to various electronics materials like heat sink materials.

BEST MODES FOR CARRYING OUT THE INVENTION

Examples of the present invention are now described in conjunction with the drawings.

EXAMPLE 1

Figure 1:
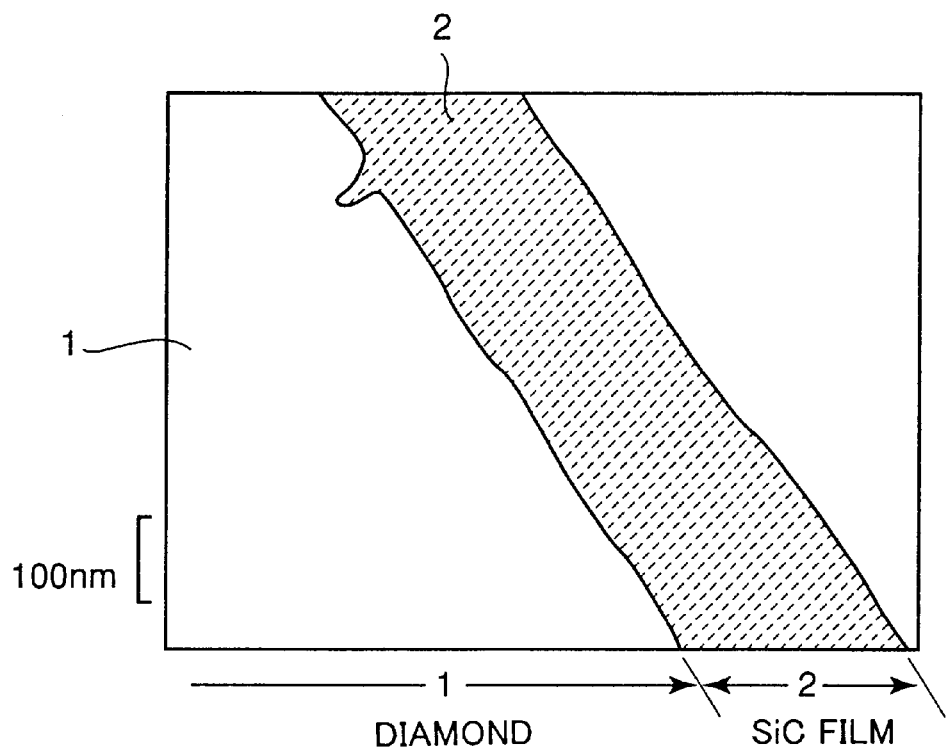
FIG. 1 shows a transmission electron microscope image of a surface portion of a coated diamond.
Figure 2:
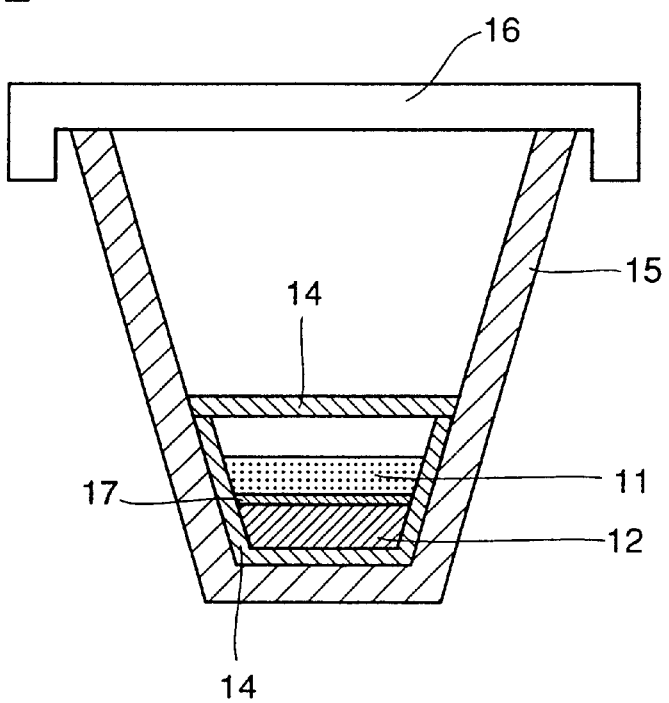
FIG. 2 shows an arrangement of materials in an alumina crucible when a coated diamond of the invention is manufactured in Example 1 of the present invention.

FIG. 1 diagrammatically shows a transmission electron microscope (TEM) picture of a surface portion of a coated diamond in Example 1 of the present invention. A method of manufacturing the coated diamond is described first. Relative to diamond particles with a mean particle diameter of 40–60 μm, SiO powder with a mean particle diameter of 200 μm or less were prepared, and they were arranged as shown in FIG. 2. Referring to FIG. 2, SiO powder 12 was placed on the bottom of an alumina crucible 15, a felt 17 made of carbon was arranged thereon as a porous separation layer, and diamond particles 11 were further deposited thereon. The carbon felt serves to prevent contact between the diamond particles and SiO powder while allowing passage of SiO in gas phase.

Figure 3:
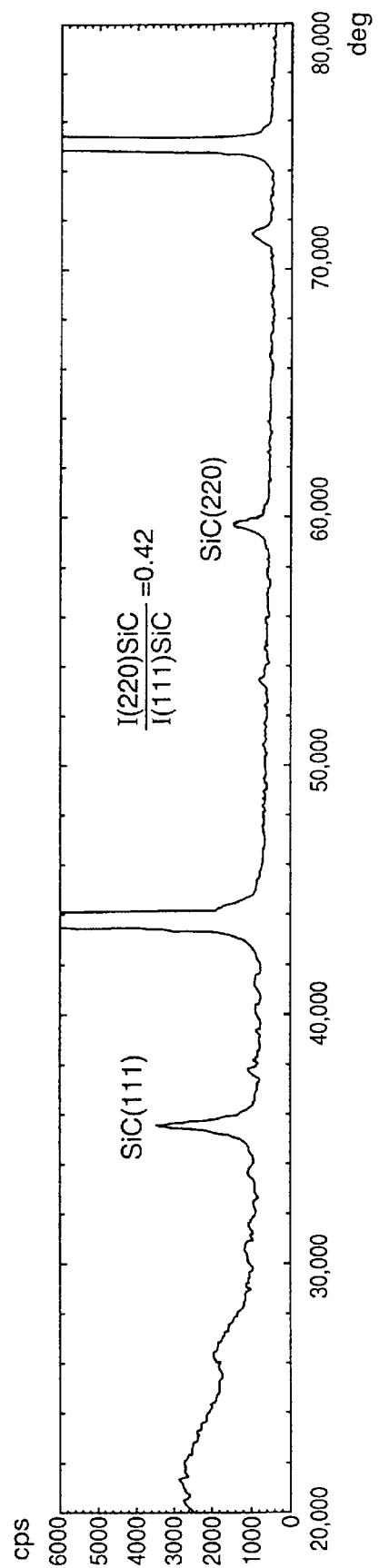
FIG. 3 shows an X-ray diffraction chart for Inventive Example 3 in Example 1 of the present invention.

The inner wall and bottom of the alumina crucible was covered with a carbon sheet 14 for preventing these diamond particles 11 and SiO powder 12 from contacting alumina crucible 15 and they were further covered with carbon sheet 14 and an alumina lid 16. Carbon sheet 14 and alumina lid 16 have functions of maintaining a high SiO partial pressure when SiO powder 12 vaporizes and of preventing diamond particles 11 from flying off. The powder thus arranged was heated in a high vacuum of $10^{-2}$ Torr or higher following the temperature and time shown in Table 1 to produce SiC-coated diamond powders. The resultant powders were observed by a scanning electron microscope (SEM) and a TEM to determine the shape of crystal grains, density, thickness of the coating film, crystal grain size, and a value of ratio I (220)/I (111) by means of X-ray diffraction, I (220) representing peak intensity of Miller index (220) of SiC and I (111) representing peak intensity of Miller index (111) of SiC. FIG. 3 shows an X-ray diffraction chart. Degree "deg" on the abscissa axis represents scan angle and "cps" (count per second) on the ordinate axis represents indication of X-ray diffraction intensity. The thickness of the SiC film was measured by using a TEM picture. Resultant measurements are shown in Table 1. It is noted that FIG. 3 referred to above is an X-ray diffraction chart for Inventive Example 3 in Table 1.

TABLE 1

|  | Process Temp (° C.) | Process Time | Crystal Type | Crystal Grain Shape | Density | Coating Thickness (μm) | Crystal Grain Size (nm) | I (220)/ I (111) |
|---|---|---|---|---|---|---|---|---|
| Inventive Example 1 | 1200 | 2 hrs | β | Equi-axial | Dense | 0.065 | 4 | 0.40 |
| Inventive Example 2 | 1300 | 2 hrs | β | Equiaxial | Dense | 0.127 | 6 | 0.41 |
| Inventive Example 3 | 1400 | 2 hrs | β | Equiaxial | Dense | 0.158 | 10 | 0.42 |
| Comparative Example 1 | 1300 | 2 min | No film formed | — | — | — | — | — |
| Comparative Example 2 | 1300 | 10 hrs | β | Equiaxial | Dense | 0.515 | 30 | 0.42 |
| Comparative Example 3 | 1100 | 2 hrs | No film formed | — | — | 0 | — | — |
| Comparative Example 4 | 1500 | 2 hrs | β | Columnar | Somewhat porous | 0.210 | 20 | 0.43 |
| Comparative Example 5 | 1300° C. for 1hr by CVD | | α + β | Equiaxial | Left non-coating | 0.2 | 100 | 0.35 |

These diamond powders were heated in an air flow at a rate of 50 ml/min to 800° C. and left for two hours to conduct an oxidation resistance test. The weight of each powder after two hours is shown in Table 2. The weight after two hours as shown in Table 2 is represented by normalizing an initial weight to 1.

TABLE 2

|  | Weight after Oxidation Resistance Test* |
|---|---|
| Inventive Example 1 | 0.96 |
| Inventive Example 2 | 1.0 |
| Inventive Example 3 | 0.95 |
| Comparative Example 1 | 0.05 |
| Comparative Example 2 | 0.31 |
| Comparative Example 3 | 0.08 |
| Comparative Example 4 | 0.11 |
| Comparative Example 5 | 0.23 |

*Weight before oxidization resistance test is normalized to 1.

As seen from Table 2, regarding the powders of Inventive Examples 1–3, diamond was prevented from vaporizing, the vaporization being caused by reaction at a high temperature of 800° C. with air, since the dense β-SiC film of equi-axial grains was uniformly formed on the powder of Inventive Examples 1–3, and consequently the weight loss was extremely small. On the other hand, regarding comparative examples except for Comparative Example 2, i.e., Comparative Examples 1 and 3–5, weight loss due to oxidation was considerably great and the weight of Comparative Example 1 decreased to approximately 5% of the initial weight. Comparative Example 2 had the SiC coating film with a somewhat greater thickness of 0.5 μm. Although Comparative Example 2 had other requirements, its weight decreased to approximately 30% of the initial weight. However, the weight loss was smaller compared with other comparative examples. From these results, it could be confirmed that the inventive examples exhibited a higher oxidation resistance than that of comparative examples. In particular, it was seen that the coated diamond powder of Inventive Example 2 lost no weight and thus had a remarkably excellent oxidation resistance.

EXAMPLE 2

Composite materials were produced respectively by using the coated diamond powders of Inventive Example 2 and Comparative Example 5 in Example 1 and respective performances were compared. The coated diamond powders were each used along with WC powder with a mean particle diameter of 5 μm and Co powder with a mean particle diameter of 1 μm to produce a hard-metal based powder mixture containing SiC coated diamond particles at a content ratio of 20 volume % and remaining WC-10 weight % Co. The powder mixture was then formed through heating at approximately 1300° C. for one minute into a disk-shaped composite material with φ30 mm and 5 mm in thickness including SiC coated diamond particles dispersed in hard metal. One side of thus produced composite material was plane-polished by a diamond wheel #200, and SiC powder with a mean particle diameter of 100 μm was then sprayed for 10 minutes to the polished surface in the direction perpendicular thereto at a pressure of 3 kgf/cm². Resultant weight losses were compared. The composite material produced by using the coated diamond powder of Inventive Example 2 in Example 1 had an amount of wear reduced to a half of that of the composite material produced by using the coated diamond powder of Comparative Example 5 in Example 1. In other words, the composite material employing the coated diamond powder of Inventive Example 2 in Example 1 exhibited a superior wear property. Accordingly, it is expected that a composite material employing coated diamond powder according to the present invention would produce a great effect by being applied to a tool material where wear property is an important factor.

EXAMPLE 3

The SiC coated diamond powders of Inventive Example 2 and Comparative Example 5 in Example 1 were each used together with Al powder of 100 μm to produce a powder mixture containing SiC coated diamond particles at a ratio of 40 volume %. This powder mixture was formed through heating at approximately 700° C. for 5 minutes into a disk-shaped composite material with φ30 mm and 5 mm in thickness including the SiC coated diamond particles dispersed in Al. Composite materials thus produced had thermal conductivities compared to reveal that the composite material employing the coated diamond powder of Inventive Example 2 in Example 1 has an excellent thermal conductivity that is approximately three times as high as the thermal conductivity of the composite material employing the coated diamond powder of Comparative Example 5. Accordingly, it is expected that a composite material employing coated diamond powder according to the present invention would produce a great effect as a heat sink material.

EXAMPLE 4

The SiC coated diamond powders of Inventive Example 2 and Comparative Example 5 in Example 1 were each used along with SiC powder, Al$_2$O$_3$ powder and phenol resin to produce a resin bond based powder mixture containing SiC coated diamond particles at a ratio of 50 volume %, SiC powder and Al$_2$O$_3$ powder at a ratio of 10 volume % and residual phenol resin. The powder mixture was formed through heating at approximately 200° C. for 30 minutes into a disk-shaped composite material with φ30 mm and 5 mm in thickness including SiC coated diamond particles dispersed in resin. One side of thus produced composite material was plane-polished by a diamond wheel #200, and the periphery of a rotating hard metal disk was pressed against the polished surface at a pressure of 5 kgf/cm$^2$ to measure the time consumed to reduce the diameter of the hard metal disk by 1 mm. The consumed time with regard to the composite material employing the coated diamond powder of Inventive Example 2 in Example 1 was almost a half of the time consumed with regard to the composite material employing the coated diamond powder of Comparative Example 5 in Example 1. Namely, it was seen that the composite material employing the coated diamond powder of Inventive Example 2 in Example 1 had an excellent grinding property. Accordingly, it is expected that a composite material employing coated diamond powder according to the present invention would produce a great effect as a wheel material where grinding property is the most important factor.

EXAMPLE 5

The method in Example 1 discussed above was used to form an SiC coating film at a coating temperature of 1300° C. on diamond powder with a mean particle diameter of 6 μm. The process time was adjusted to produce SiC coated diamond powders covered with respective SiC coating films different in thickness as shown in Table 3.

TABLE 3

| | SiC Coating Thickness (nm) | Result of Abrasion Resistance Test | Crystallographic Orientation Relationship between SiC Film and Diamond | Crystal Grain Shape |
|---|---|---|---|---|
| Comparative Example 6 | 0 | 100 | — | — |
| Inventive Example 4 | 2 | 13 | An identical relationship (Epitaxial) | Unclear |

TABLE 3-continued

| | SiC Coating Thickness (nm) | Result of Abrasion Resistance Test | Crystallographic Orientation Relationship between SiC Film and Diamond | Crystal Grain Shape |
|---|---|---|---|---|
| Inventive Example 5 | 5 | 2 | An identical relationship (Epitaxial) | Unclear |
| Inventive Example 6 | 30 | 1 | An identical relationship (Epitaxial) | Unclear |
| Inventive Example 7 | 100 | 3 | An identical relationship (Epitaxial) | Unclear |
| Inventive Example 8 | 150 | 11 | Different | Equi-axial |
| Inventive Example 9 | 200 | 16 | Different | Equi-axial |
| Inventive Example 10 | 290 | 22 | Different | Equi-axial |
| Comparative Example 7 | 480 | 53 | Different | Equi-axial |

Resultant SiC coated diamond powders were each dry-blended with a hard metal powder having a composition of WC—5 weight % Co—0.5 weight % Ni—0.3 weight % Cr (mean particle diameter of WC material powder was approximately 1 μm). An on-current-pressure-sintering apparatus was used to sinter the powders in a high vacuum of 0.01 Torr or higher at approximately 1300° C. for 2 minutes. By the sintering, a disk-shaped composite material of 30 mm in diameter and 5 mm in thickness could be produced including diamond particles dispersed in hard metal. Both sides of the composite material thus produced were plane-polished by a diamond wheel #200 and one side thereof was thereafter mirror-polished by means of a diamond paste #3000. The mirror-polished side was subjected to a dry abrasion resistance test for 3 hours by means of a pin on disk apparatus using a superhard ball at a sliding rate of 3 m/min and with a load of 20 N.

Results of the abrasion resistance test are shown in Table 3 indicating the values by defining the amount of wear of the sample of Comparative Example 6 having no SiC coating as 100. As seen from Table 3, Inventive Examples 4 to 10 have a superior abrasion resistance relative to samples of Comparative Examples 6 and 7. In particular, composite materials of Inventive Examples 5–7 having SiC films with the thickness ranging from 5 to 100 nm exhibited a remarkably excellent abrasion resistance. It is also seen that, when the SiC film thickness is smaller than 100 nm, (a) the SiC film and diamond have an identical orientation relationship in terms of crystallography (epitaxial relation) and (b) composite materials have no specific crystal grain shape. The reason why characteristics (a) and (b) are exhibited is considered that SiC is single crystal.

According to results of Example 5 discussed above, an optimum SiC film thickness greatly enhances abrasion resistance of a composite material and thus makes the composite material highly advantageous with respect to an abrasion resistant tool material.

Although the present invention has been described in relation to Examples thereof, the description is merely presented as illustration and the scope of the invention is not limited to these Examples. The present invention is limited by the appended scope of claims and includes all variations in the meaning equivalent to and covered by the recitation of the claims.

Industrial Applicability

According to the present invention, an SiC film with a film quality of β-SiC can be used to achieve a coated diamond which is dense and excellent in adherence and enables diamond to exhibit its superior characteristics, and achieve a manufacturing method and a composite material of such a coated diamond. Materials according to the present invention can be used to readily produce tool materials with a high abrasion resistance, heat sink materials with a high thermal conductivity and the like.

What is claimed is:

1. A coated diamond comprising:
    a diamond (1); and
    a film (2) coating said diamond and including SiC as a main component,
    said SiC being substantially formed of β-SiC, and
    for said film including the SiC as a main component, a value of I(220)/I(111) being at least 0.38 and at most 0.55 where I(220) represents peak intensity of Miller index (220) of the SiC and I(111) represents peak intensity of Miller index (111) of the SiC.

2. The coated diamond according to claim 1, wherein said film (2) including the SiC as a main component has at least a partial region in a crystallographically identical orientation relationship with respect to an adjacent portion of said diamond (1).

3. The coated diamond according to claim 1, further comprising an intermediate layer interposed at least between parts of said film (2) including the SiC as a main component and said diamond (1).

4. The coated diamond according to claim 1, wherein said film (2) including the SiC as a main component is substantially formed of equi-axial grains.

5. The coated diamond according to claim 1, wherein said film (2) including the SiC as a main component has a thickness of 0.001 to 0.3 μm.

6. The coated diamond according to claim 1, wherein said film (2) including the SiC as a main component has a thickness of 0.005 to 0.1 μm.

7. The coated diamond according to claim 1, wherein said SiC has a mean grain diameter of at most 50 nm.

8. The coated diamond according to claim 1, wherein said SiC has a mean grain diameter of at most 15 nm.

9. The coated diamond according to claim 1, wherein said diamond (1) is particulate and has a mean particle diameter of 0.1 to 100 μm.

10. The coated diamond according to claim 1, wherein said diamond (1) is plate-shaped and of single crystal.

11. The coated diamond according to claim 1, wherein said diamond (1) is plate-shaped and of polycrystal.

12. A composite material comprising:
    at least one of metal, ceramic and resin;
    a diamond (1); and
    a film (2) coating said diamond (1) and including β-SiC as a main component, wherein said film has a value of a ratio of I(220)/I(111) being at least 0.38 and at most 0.55 where I(220) represents a peak intensity of Miller index (220) of the Sic and I(111) represents a peak intensity of Miller index (111) of the SiC;
    said at least one of metal, ceramic and resin and said diamond coated with said film being connected.

13. The composite material according to claim 12, wherein said film (2) including the SiC as a main component has a thickness of 0.005 to 0.1 μm.

14. The composite material according to claim 12, wherein said at least one of metal, ceramic and resin is at least one of particulate metal, particulate ceramic and particulate resin, and wherein said diamond is particulate diamond.

15. A method of manufacturing a coated diamond, comprising arranging silicon monoxide (12) in solid phase and diamond (11) in solid phase at respective positions having no contact with each other and allowing passage of gas therebetween, and heating said solid phase silicon monoxide and said solid phase diamond in a temperature range of 1150 to 1450° C.

16. The method of manufacturing a coated diamond according to claim 15, wherein said solid phase silicon monoxide (12) is arranged below said solid phase diamond (11) with a porous separation layer (17) arranged between said silicon monoxide and said diamond.

17. The method of manufacturing a coated diamond according to claim 16, wherein said porous separation layer is a felt (17) formed of carbon.

18. The method of manufacturing a coated diamond according to claim 15, wherein said silicon monoxide (12) and said diamond (11) are placed in a container (15) having a lid (16) put on the container, said container is provided in a high vacuum of at least $10^{-2}$ Torr, and thereafter said heating is performed.

19. The method of manufacturing a coated diamond according to claim 18, wherein said container is an alumina crucible (15) having its interior covered with a carbon sheet (14), the lid (16) formed of alumina is put on said alumina crucible to shield said silicon monoxide and said diamond in said container from outside air, and said heating is performed for said alumina crucible including said silicon monoxide and said diamond for 10 minutes to 6 hours.

20. The method of manufacturing a coated diamond according to claim 19, wherein said diamond and said silicon monoxide placed in said alumina crucible have a weight ratio of (2:1) to (20:1).

21. The method of manufacturing a coated diamond according to claim 15, wherein said diamond is a single crystal diamond having a mean particle diameter of 0.1 to 3000 μm.

22. The method of manufacturing a coated diamond according to claim 15, wherein said diamond is of single crystal and in a shape of plate.

23. The method of manufacturing a coated diamond according to claim 15, wherein said diamond is of polycrystal and in a shape of plate.

* * * * *

UNITED STATES PATENT AND TRADEMARK OFFICE
CERTIFICATE OF CORRECTION

PATENT NO.   : 6,673,439 B1
DATED        : January 6, 2004
INVENTOR(S)  : Miyamoto et al.

It is certified that error appears in the above-identified patent and that said Letters Patent is hereby corrected as shown below:

<u>Title page,</u>
Item [*] Notice, replace "67 days" by -- 68 days --;
Item [86], after "Date:", replace "May 22, 2001", by -- May 21, 2001 --.
Item [56], OTHER PUBLICATIONS, replace "Cermaics" by Ceramics --.

Signed and Sealed this

Sixth Day of April, 2004

JON W. DUDAS
*Acting Director of the United States Patent and Trademark Office*